US006584553B2

(12) United States Patent
Howell

(10) Patent No.: US 6,584,553 B2
(45) Date of Patent: Jun. 24, 2003

(54) METHOD AND SYSTEM FOR SEQUENTIALLY PROGRAMMING MEMORY-CONTAINING INTEGRATED CIRCUITS

(75) Inventor: Robert L. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 175 days.

(21) Appl. No.: 09/918,618

(22) Filed: Jul. 30, 2001

(65) Prior Publication Data

US 2002/0013878 A1 Jan. 31, 2002

Related U.S. Application Data

(60) Provisional application No. 60/221,806, filed on Jul. 31, 2000.

(51) Int. Cl.[7] .............................................. G06F 12/00
(52) U.S. Cl. ..................................... 711/168; 711/102
(58) Field of Search ................................ 711/102, 103, 711/168; 365/230.03

(56) References Cited

U.S. PATENT DOCUMENTS

| | | | | | |
|---|---|---|---|---|---|
| 4,578,751 A | * | 3/1986 | Erwin | ......................... | 711/103 |
| 4,684,182 A | * | 8/1987 | Gussman | ..................... | 439/68 |
| 5,187,794 A | * | 2/1993 | Hall | .............................. | 713/1 |
| 5,466,117 A | * | 11/1995 | Resler et al. | ................ | 414/799 |
| 5,561,628 A | * | 10/1996 | Terada et al. | .......... | 365/185.04 |
| 5,691,907 A | * | 11/1997 | Resler et al. | ................ | 700/121 |
| 6,236,593 B1 | * | 5/2001 | Hong et al. | ............. | 365/185.11 |
| 6,351,774 B1 | * | 2/2002 | White | ......................... | 709/228 |
| 6,392,427 B1 | * | 5/2002 | Yang | ............................ | 324/755 |
| 6,415,397 B1 | * | 7/2002 | Co et al. | ....................... | 714/42 |
| 6,515,470 B2 | * | 2/2003 | Suzuki et al. | ............. | 324/158.1 |
| 2002/0199142 A1 | * | 12/2002 | Gefen | ......................... | 714/724 |

* cited by examiner

Primary Examiner—Kevin Verbrugge
(74) Attorney, Agent, or Firm—Dorsey & Whitney LLP

(57) ABSTRACT

Data to be programmed into memory-containing ICs is divided into a number (X) of blocks preferably equal to the number of sockets on a common programmer unit. A pick-up head inserts an unprogrammed IC into the first socket and the IC is programmed with a first data block A. While programming is occurring the pick-up head fetches an unprogrammed IC and inserts it into a second socket, whereupon both ICs are simultaneously programmed with the second data block B. During this time an unprogrammed IC is fetched and inserted into a third socket, whereupon all socketed ICs are simultaneously programmed with a third data block C. Eventually the first IC is fully programmed and is replaced with an unprogrammed IC and the cycle continues until all ICs to be programmed have been programmed. Multiple pick-up heads and/or multi-socketed programming units can be used.

21 Claims, 4 Drawing Sheets

METHOD AND SYSTEM FOR SEQUENTIALLY PROGRAMMING MEMORY-CONTAINING INTEGRATED CIRCUITS

RELATION TO PREVIOUSLY FILED APPLICATION

This application claims priority from applicant's U.S. provisional application Ser. No. 60/221,806 filed on Jul. 31, 2000 entitled "Method for Segmented Programming of Packaged Integrated Circuits and Apparatus for Same".

FIELD OF THE INVENTION

The present invention relates generally to programming data into memory on packaged integrated circuits (ICs) on an automated system, and more particularly to reducing the time required to program a plurality of such ICs.

BACKGROUND OF THE INVENTION

Various functions including memory storage can be implemented on a single integrated circuit (IC) that is programmed and then packaged. In many applications, it is necessary to program or store data in memory on such ICs after packaging has occurred. Various pin-out connections from the memory to package pins are provided and data may be programmed into the memory using various systems that preferably are automated.

FIG. 1A depicts a prior art system 10 for programming data into a plurality of memory containing ICs 20-1, 20-2, 20-x. System 10 includes a pick-up head 30 that can move in three dimensions (x,y,z) along a gantry 40 that is part of a handler 50. The pick-up head can take an IC from an in-tray 60 containing unprogrammed ICs, and manipulate and insert that IC into a socket 70-x on a single programmer 80 associated with system 10. After successful programming of data, the ICs are again manipulated by pick-up head 30 and placed in an out-tray 90. FIG. 1A also depicts the x,y,z axis associated with the system.

Data is programmed into the ICs in blocks, where the total number of blocks of data is determined by the size of the memory to be programmed. ICs containing large storage memory will thus be programmed with a large number of blocks of data. Thus, one function of programmer 80 is to program the data blocks to be stored into memory in the ICs in the sockets of the programmer.

In the prior art system shown in FIG. 1A, each socket 70-x in the programmer 80 is loaded with an IC 20-x to be programmed, and the identical programming cycle step is carried out in each IC simultaneously. A typical system 10 operation cycle includes an insertion check step, an erase step, a programming step, a verification step, and a security check step.

Thus, in a lock-step system such as system 10, each IC is inserted into the programmer simultaneously, each IC memory is erased simultaneously, and is then programmed with the same block of data simultaneously, and each programmed IC is then verified simultaneously. Finally, a security check is then carried out on all ICs simultaneously. After the first block of data has been successfully programmed into each memory, programmer 80 can start to program the next block of data into each IC, and so forth until all blocks of data have been loaded into each IC.

While the above described parallel operation may sound efficient, it is important to appreciate that most of the system 10 cycle time is occupied while programming the data. The remaining cycle tasks occupy relatively little time. The insertion portion of a cycle involves confirming correct orientation of the inserted IC with respect to the socket on the programmer, a task rapidly carried out. But programming is quite slow in that much data in a block is required to be written to memory for each IC, each IC being simultaneously programmed with the same block of data. Once the block of data has been programmed into each IC, the step of verifying that the data block was correctly programmed into memory can be carried out quite rapidly. A security check typically involves reading but a few bits of data and is also carried out quite rapidly. ICs that have been verified as being programmed are then manipulated by pick-up head 30 and placed in the out-tray 90. The out-tray can then be removed and the ICs that have been successfully programmed can be taken elsewhere, for example for insertion into a printed circuit board.

An advantage of system 10 is that a common set of programming electronics is wired to each socket in the programmer, which can represent a cost savings in the manufacture of system 10. Further, the individual sockets can be more densely packed, which means the overall size of the programmer unit can be reduced. But a main disadvantage associated with the parallel nature of prior art system 10 is that one must first wait for all sockets to be loaded, and then wait a substantial fraction of a system cycle for programming of the same data block to occur for each IC. During these relatively long time periods, little else can occur within system 10.

Prior art system 10' shown in FIG. 1B attempts to reduce the relatively long dead time periods noted in the configuration of FIG. 1A by introducing asynchronous operation into the system. In system 10', a separate programmer 80-x is provided for each socket 80-x into which a memory containing IC 20-x can be inserted by pick-up head 30 for programming with blocks of data by the associated programmer.

In the configuration of FIG. 1B, as soon as pick-up head 30 has retrieved IC 20-1 from in-tray 60 and has inserted IC 20-1 into socket 70-1, and proper insertion has been confirmed, the associated programmer 80-1 can begin programming the first block of data into the IC memory. After the data has been programmed, verification and security checks are carried out on IC 20-1. Once pick-up head 30 has corrected seated IC 20-1 into socket 70-1, the pick-up head can retrieve IC 20-2 and insert this IC into socket 70-2, and as soon as insertion is confirmed, the separate programmer 80-2 associated with socket 70-2 can begin programming IC 20-2, and so on.

While system 10' offers the advantage of asynchronous programming of the various ICs, it will be appreciated that a plurality of programmer units 80-x must now be provided, one programmer unit per an associated socket 70-x. Each programming site or socket can operate independently without having to wait until every socket is loaded with an IC or unloaded with a programmed (or rejected) IC. But having to provide a plurality of programmers adds expense to the overall system. Further, it is generally required that each socket 70-x be spaced somewhat farther apart than in the configuration of FIG. 1A.

What is needed then is a programming system that can operate more rapidly than prior art synchronous parallel systems, but without requiring a separate dedicated programmer unit for each programming site.

The present invention provides such a programming system, and a method of programming with such system.

SUMMARY OF THE INVENTION

The present invention provides a programming system that includes a single programmer with multiple programming sites or sockets that can be densely packed on the programmer. The data to be programmed into each IC in a socket in the programming system is broken down into a number of blocks that are programmed into each IC in a segmented sequence. The number of blocks of data to be programmed into an IC is equal to X where X preferably is the number of programming sites or IC sockets in the programming system. Thus if the size of the data to be programmed is Q, each block of data represents the Q/X.

The system pick-up head obtains the first IC, typically from an in-tray, and inserts the first IC into the first programming socket, where it is insertion-checked and programmed with only the first block of data to be stored. The pick-up head then inserts the second IC into the second programming socket where it is insertion-checked and the first and second IC are now simultaneously programmed with the second block of data, whereupon the first IC will now contain two data blocks, and the second IC will contain one data block. The pick-up head inserts the third IC into the third programming socket where it is insertion-checked and the first, second, and third IC are simultaneously programmed with only the third data block, whereupon the first IC now is programmed with three data blocks, the second IC with two data blocks, the third IC with one data block.

The above cycle is repeated a number of times, typically equal to X, until the first IC is completely programmed and is now verified, whereupon the pick-up head removes the first IC and inserts a new IC into the first socket and performs an insertion-check. The removed IC can be placed by the pick-up head into an out-tray. All ICs are now programmed with the first data block. This procedure is repeated until all ICs requiring programming have been programmed.

The present invention thus rapidly programs a plurality of ICs using a single programmer that sequentially programs the same block of data into all ICs present in a programming site or socket. Preferably the pick-up heads can retain at least two ICs simultaneously, for example an unprogrammed IC about to be inserted into a socket, and a programmed IC just removed from a socket. Further, the present invention can be implemented with multiple pick-up heads and multiple programming stations, where each programming station simultaneously programs the same data block into each IC socket in that station. An overall system according to the present invention can be less expensively implemented than systems requiring dedicated programmers per program site, and the density of the program sockets can be relatively high.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 1A:
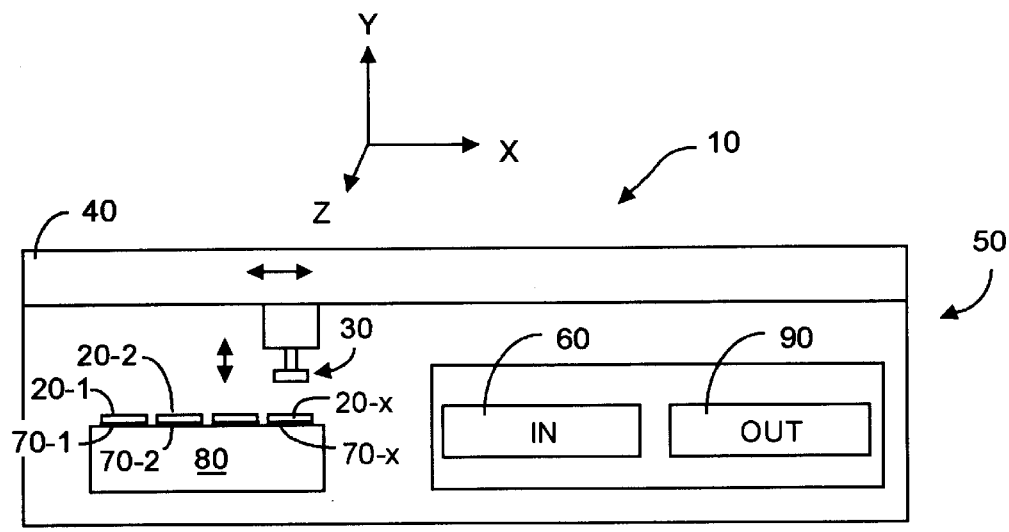
FIG. 1A depicts a synchronous parallel operating programming system, according to the prior art.
Figure 1B:
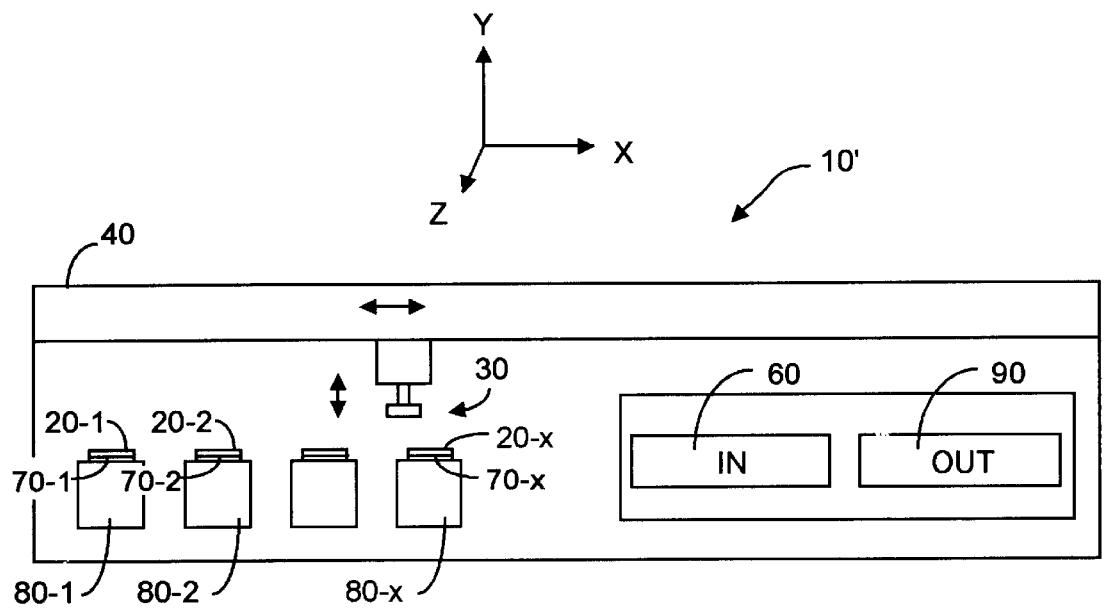
FIG. 1B depicts an asynchronous operating programming system, according to the prior art.
Figure 2A:
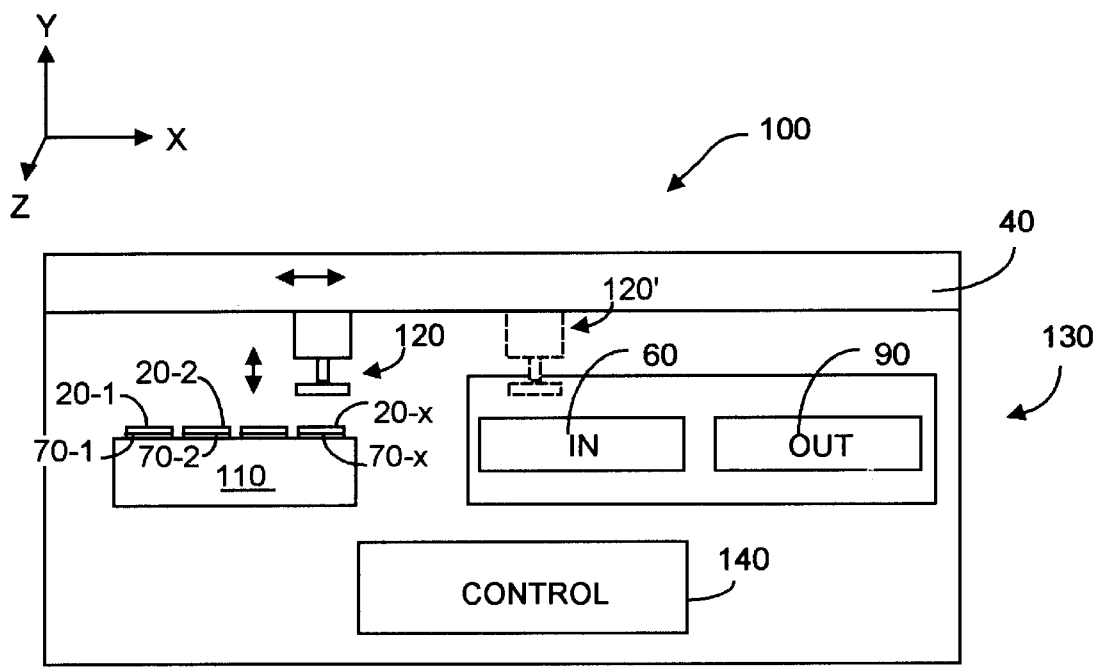
FIG. 2A depicts a first embodiment of a sequential programming system, according to the present invention.

FIG. 2A depicts a system 100 that includes a handler 130 having a gantry 40 along which a pick-up head 120 can move, preferably under command of a control unit 140. System 100 is used to program data into memory containing ICs 20-$x$, according to a first embodiment of the present invention. Unless otherwise noted herein, components bearing like element numerals may be identical to elements described elsewhere herein. Without limitation, ICs 20-$x$ may be memory devices, microprocessors, or other programmable memory-containing IC.

In system 100, pick-up head 120 can move along gantry 40 and pick-up ICs 20-$x$ from in-tray 60 for insertion into a socket 70-$x$ on a single programmer unit 110 on handler 130. The nature of the programming operation for system 100 and for dual-system 100' (to be described with reference to FIG. 2C) is best understood from FIGS. 3A–3H. The data to be programmed is divided into a number of blocks, e.g., X blocks, preferably equal to the number of test site sockets, according to the present invention. For ease of illustration, in FIGS. 3A–3H it is assumed that system 100 has four (e.g., X=4) programming sites or sockets, and thus the data to be programmed into memory in the ICs is broken down into a total of four blocks of data (denoted A, B, C, D). Thus if the size of the data to be programmed is Q bytes, each program block will be Q/X or Q/4 in size. Of course in practice, more or less than four programming sites or sockets may be present, such that the number of data blocks to be programmed can differ from four.

Figure 3A:
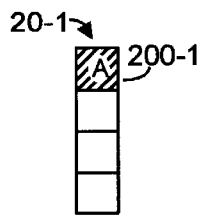
FIGS. 3A to 3H depict sequential programming of data blocks in an exemplary system having four programming sites, according to the present invention.

In FIG. 2A, once pick-up head 120 has properly inserted IC 20-1 into socket 70-1 in the common programmer unit 110, programmer 110 runs an insertion check, and the first block of data A is written into memory 200-1 in the IC, as shown in FIG. 3A. Typically programming speed is on the order of about 8 $\mu$S per byte of data. As soon as pick-up head 120 has completed inserting IC 20-1 into socket 70-1, the pick-up will return to in-tray 60 to fetch the next IC 20-2, which it can now insert into socket 70-2. This action can occur while the first block of data A is being written to IC 20-1. It is understood in FIG. 3A that the second, third, and fourth test sites or sockets (not shown) are empty. Of course the use of sockets is a preferred mechanism to coupled an IC to be programmed to programming system 100, but other coupling mechanisms could instead be used, for example holding contacts on an IC against signal pads associated with system 100.

Figure 2B:
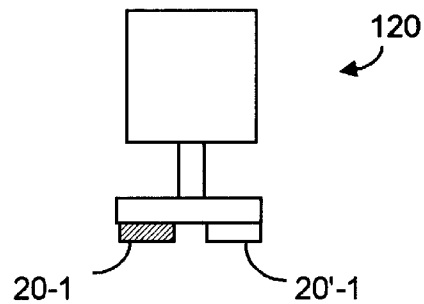
FIG. 2B depicts a preferred embodiment of a dual-head pick-up head, according to the present invention.

More preferably, as shown in FIG. 2B, pick-up head 120 is a dual-head in that it can simultaneously retain two ICs. In FIG. 2B, pick-up head 120 preferably will have fetched unprogrammed IC 20-2 from in-tray 60 and will have moved along gantry 50 to socket 70-2, where it inserts IC 20-2 into empty socket 70-2.

Programmer 110 does an insertion check to confirm that IC 20-2 is properly oriented and seated in socket 70-2. Since mechanical movement of a pick-up head along the gantry from a socket to or from tray 60 or 90 can take few seconds, it will be appreciated that use of a dual head pick-up head 120 can expedite loading and unloading ICs, according to the present invention.

Figure 3E:
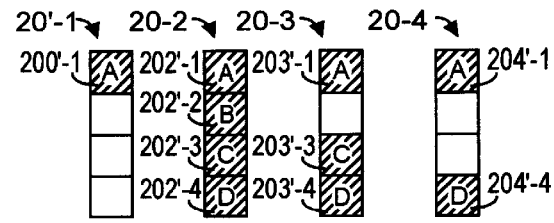
Figure 3B:
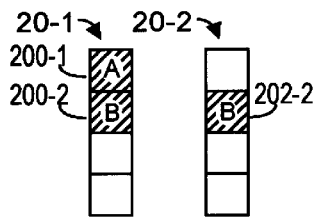

As shown in FIG. 3B, the second block of data B is now simultaneously written by the common programmer 110 into memory portion 200-2 in first IC 20-1 in socket 70-1, and into memory 202-2 the second IC 20-2 in socket 70-2. Note that at this juncture, IC 20-1 will thus be programmed with two blocks of data (A, B), whereas the second IC 20-2 will only be programmed with one block of data (B). Programmed blocks of data are depicted herein with cross-hatching.

As soon as the second IC 20-2 is seated in socket 70-2, pick-up head 120 is free to return to in-tray 60 to fetch another IC, 20-3, which it will insert into the next free socket 70-3. Again, programmer 110 will do an insertion check on the newly socketed IC. Note that it is not necessary for the pick-up head to simply wait for programming of a data block to complete before the pick-up head can be repositioning along the gantry.

At this juncture there are three socketed ICs: IC 20-1, which is programmed with the first two blocks of data A, B, IC 20-2, which is programmed with the second block of data B, and IC 20-3, as yet unprogrammed. As shown in FIG. 3C, at this time common programmer unit 110 simultaneously programs the third block of data C into all three socketed ICs. Pick-up head 120 need not wait for programming of data block C to complete, but instead as soon as IC 20-3 has been socketed, gantry 40 moves pick-up head 120 to in-tray 60 to retrieve another IC, 20-4, which will be inserted into the fourth socket 70-4 (or 70-x, where x=4). It will be appreciated that data programming of each socketed IC by programmer 110, and mechanical movement associated with handler 50 and pick-up head 120 can occur essentially continuously with little wasted dead time, according to the present invention.

Pick-up head 120 will seat IC 20-4 in the next socket, 70-4 in the common programmer unit 110, and an insertion check will be carried out by the programmer. Next, all socketed ICs are simultaneously programmed with the next block of data, block D, as shown in FIG. 3D. Once block D has been programmed, the first IC 20-1 will have been completely programmed with data blocks A, B, C, and D in respective memory regions 200-1, 200-2, 200-3, 200-4 (assuming again the total number of blocks of data to be programmed is four). Note that IC 20-2 is currently programmed with three blocks of data, B, C, and D in respective memory regions 202-2, 202-3, 202-4, that IC 20-3 is programmed with two blocks of data C, and D in respective memory regions 203-3, 203-4, and that the most recently socketed IC, IC 20-4, is programmed only with the fourth block of data, D in memory region 204-4.

When an IC is completely programmed, e.g., IC 20-1, programmer 110 will carry out a step to verify the programming, e.g., that blocks A, B, C, D are indeed programmed within IC 20-1. If for any reason verification cannot be accomplished, programmer 110 can identify the IC in question as being potentially defective and can command pick-up head 120 to remove and perhaps discard the IC. Assuming that the verification check is successful, typically programmer 110 will blow or break a security link within the successfully programmed IC, to preserve the memory contents, e.g., in a read-only-memory function. The blown link can be a thin fusible element within the IC that will break continuity if programmer 110 intentionally passes too much current through the link. Once the security link is broken, the contents of the memory regions cannot thereafter be re-programmed. The time required to carry-out the verification and blowing of the security link for a fully programmed IC is very small.

Assume that pick-up head 120 is a dual head, such as shown in FIG. 2B. While the fourth block of data D is being programmed into all socketed ICs, the pick-up head will have moved along the gantry to fetch an unprogrammed IC 20'-1 from in-tray 60, and will have moved back along the gantry over socket 70-1. The pick-up head will now remove the completely programmed, verified, and security link-blown IC 20-1 from the first socket, 70-1. The pick-up head will insert the unprogrammed IC 20'-1 into the socket, and will move IC 20-1 into the out-tray 90. (Note that a single head pick-up would have to first remove programmed IC 20-1 from socket 70-1, place the IC into the out-tray 90, fetched unprogrammed IC 20'-1 from in-tray 60, and then moved to place IC 20'-1 in socket 70-1. Clearly, a dual-head pick-up head 120 can save time and motion.) As soon as IC 20'-1 has been placed in the socket, an insertion check is carried out by programmer 110. Next, as shown in FIG. 3E, programmer unit 110 now simultaneously programs all socketed ICs with the first block of data A, after which the second IC, 20-2, will be completely programmed. As noted, programmer 110 will verify integrity of the programming for IC 20-2, and upon verification will blow the security link within the IC to preserve the memory contents.

While block A is being programmed into all socketed ICs, pick-up head 120 will have fetched an unprogrammed IC 20'-2 from the in-tray and will have moved over socket 70-2. The pick-up head will now remove the completely programmed second IC from the second socket 70-2, and will place IC 20'-2 in the socket, after which programmer 110 will do an insertion check on IC 20'-2. The pick-up head will now move the programmed second IC 20-2 and place it in the out-tray, and fetch a new IC, 20'-3 from the in-tray.

At this juncture, IC 20'-1 in the first socket has been programmed with first data block A in memory region 200'-1, IC 20'-2 in the second socket is unprogrammed, IC 20-3 in the third socket has been programmed with data blocks A, C, and D in respective memory regions 203'-1, 203'-3, 203'-4, and IC 20-4 in the fourth socket 70-4 has been programmed with data blocks A and D in respective memory regions 204'-1, 204'-4.

Figure 3F:
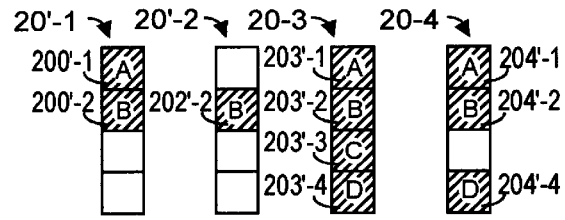
Figure 3C:
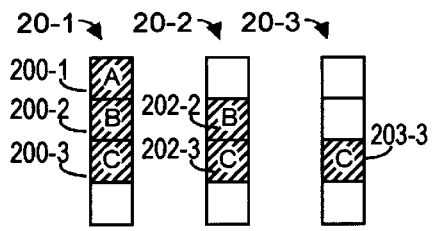
Figure 3G:
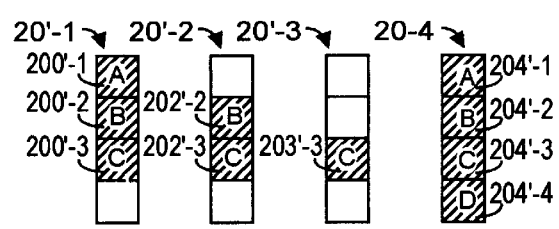
Figure 3D:
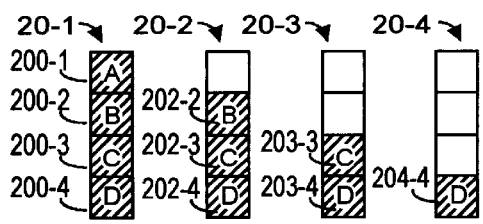
Figure 3H:
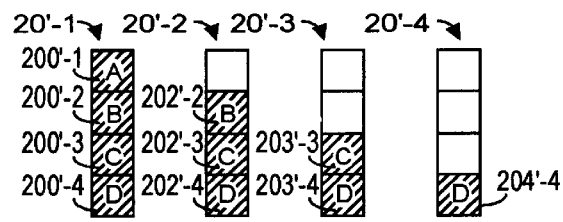

Turning now to FIG. 3F, the common programmer 110 now programs second data block B into each socketed IC, after which IC 20-3 in socket 70-3 will have been completely programmed with data blocks A, B, C, and D. Again, fully programmed IC 20-3 will be subjected to a verification test after which programmer 110 will blow the security link internal to this IC. Pick-up head 120, which preferably already holds unprogrammed IC 20'-3, removes the fully programmed IC 20-3, and inserts IC 20'-3 in socket 70-3, whereupon programmer 110 carries out an insertion check. Pick-up head 120 can now place programmed IC 20-3 in out-tray 90, and fetch an unprogrammed IC 20'-4 from in-tray 60, and can move adjacent socket 70-4.

While the pick-up head is moving, programmer 110 will simultaneously load the third data block C into all seated ICs. Before data block C is programmed, IC 20'-1 in the first socket will have been programmed with data block A and B, IC 20'-2 in the second socket will have been programmed with data block B, IC 20'-3 in the third socket will still be unprogrammed, and IC 20-4 in fourth socket 70-4 will have been programmed with blocks A, B, and D.

After programmer unit 110 simultaneously programs the third data block C into each socketed IC, IC 20-4 in socket 70-4 will be completely programmed, and will be subjected to a verification test and a blowing of its internal security link. Fully programmed IC 20-4 will then be removed by pick-up head 120, which preferably already holds an unprogrammed IC 20'-4, which it will insert into socket 70-4.

While pick-up head 120 is moving programmed IC 20-4 for deposit into out-tray 90, programmer unit 110 carries out an insertion check on IC 20'-4, and then simultaneously programs the fourth data block D into each socketed IC. After programming block D into each socketed IC, IC 20'-1 in the first socket 70-1 will be completely programmed, see FIG. 3H. At this juncture, IC 20'-2 in the second socket will have been programmed with data blocks B, C, D in memory regions 202'-2, 202'-3, 202'-4, IC 20'-3 in the third socket will have been programmed with data blocks C and D in memory regions 203'-3, 203'-4, and in the fourth socket, IC 20'-4 will have been programmed with data block D in memory region 204'-4.

The above series of steps is now repeated until all unprogrammed ICs in the in-tray have been inserted into the programmer and successfully programmed, verified, and have had their internal security links blown to protect the memory contents. Thus, after the programming step shown in FIG. 3H, pick-up head 120 will remove programmed IC 20'-1 to deposit into the out-tray and will have fetched an unprogrammed IC that it now inserts into the first empty socket 70-1. After performing an insertion check, programmer 110 will program the first data block A into each seated IC, after which the status of the seated ICs will be similar to what is shown in FIG. 3E except that the first IC may now be denoted, for example, as 20"-1.

It will be appreciated that sequential programming according to the present invention can quicken the overall programming process, without requiring the programming system to provide a separate (and often costly) programmer unit 110 for each socket or programming site. If desired, system 100, shown in FIG. 2A, could include more than one pick-up head, e.g., heads 120, 120' to expedite the programming process, especially if multiple in-trays and out-trays are used.

Figure 2C:
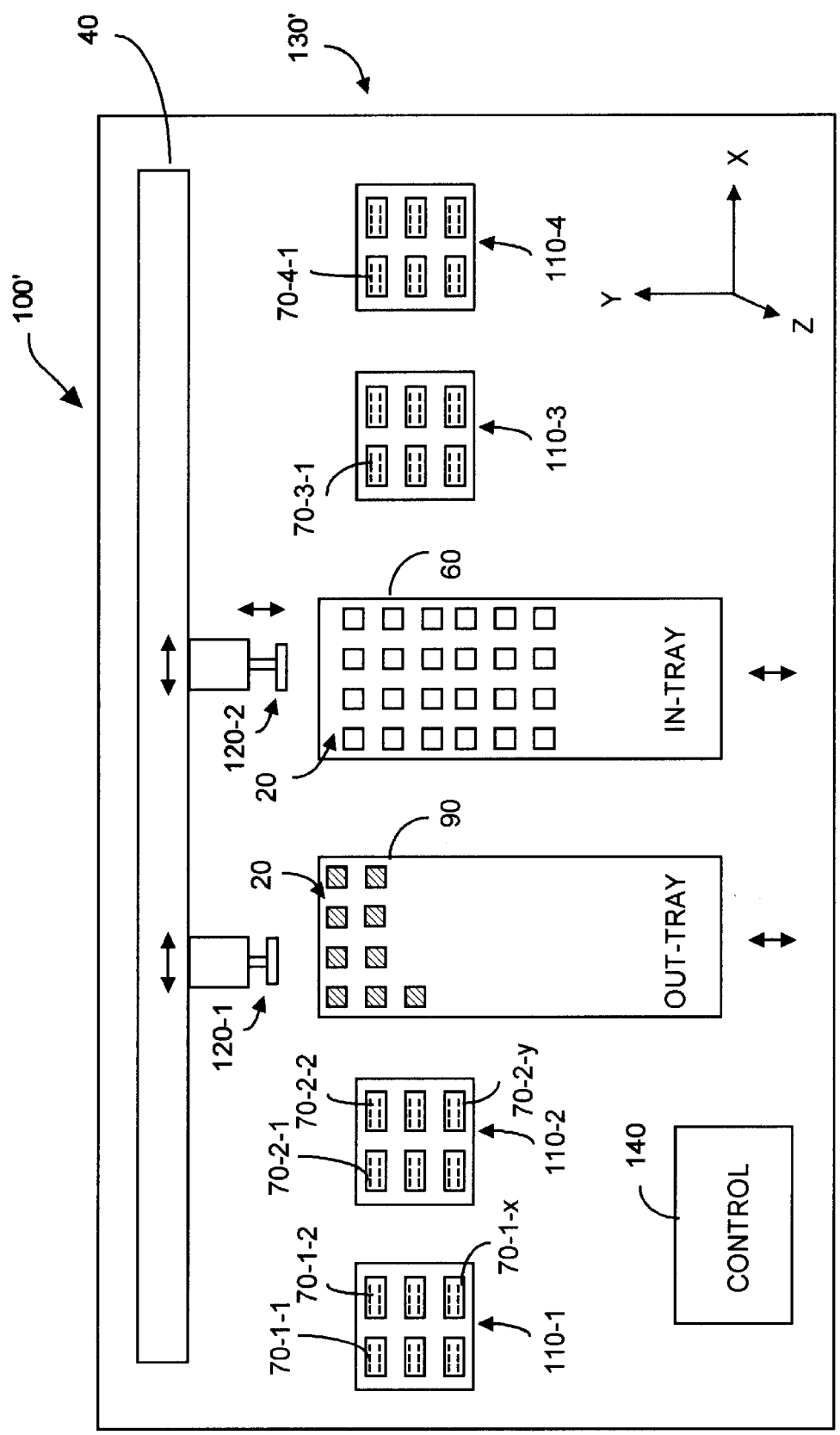
FIG. 2C depicts a second embodiment of a system with multiple sequentially programming units, according to the present invention.

An even faster programming system is shown in FIG. 2C, wherein system 100' includes at least two pick-up heads 120-1, 120-2 and at least two programming units 110-1, . . . 110-x, to further expedite the programming process. While FIG. 2C depicts system 100' as including two pick-up heads and four programming units, it is understood that a different number of pick-up heads and/or a different number of programming units could be used.

As with system 100, each programming unit will simultaneously program a number of ICs inserted into associated sockets or programming sites. Thus, programming unit 110-1 includes sockets 70-1-1, 70-1-2, 70-1-x, programming unit 110-2 includes sockets 70-2-1, . . . 70-2-y, where y need not equal x, and so forth. While system 100' is depicted with one in-tray 60 and one out-tray 90, multiple in-trays and/or out-trays could be provided. In FIG. 2C, the ICs 20 shown in out-tray 90 are cross-hatched to represent that these ICs have already been successfully programmed by one of the programming units, e.g., 110-1, 110-2, 110-3, etc. shown.

Programming through-put can be enhanced with system 100' in several ways. The presence of multiple programming units, each servicing a plurality of sockets can result in more ICs being programmed per unit time than if a single programming unit were used. This aspect of system 100' can be enhanced by co-ordinating movement of the pick-up heads 120-1, 120-2. Preferably the pick-up heads will be in substantially continuous motion along gantry 40 such that when one pick-up head is inserting an unprogrammed IC from an in-tray into a programming socket, the other pick-up head is moving a programmed IC from a programming socket into the out-tray. It is not required that a pick-up head service only one programming unit. Control system 140 preferably commands movement and operation of each pick-up head, and can co-ordinate cycles within each programming unit.

Modifications and variations may be made to the disclosed embodiments without departing from the subject and spirit of the invention as defined by the following claims.

What is claimed is:

1. A method of sequentially programming memory-containing integrated circuits (ICs) with data, comprising the following steps:
    (a) providing a number of programming sites equal to X;
    (b) dividing said data into X memory blocks;
    (c) coupling a first IC to a first of said sites and programming memory in said IC with a first of said memory blocks; and
    (d) coupling a second IC to a second of said sites and simultaneously programming memory in said first IC and said second IC with a second of said memory blocks.

2. The method of claim 1, further including:
    (e) coupling a third IC to a third of said sites and simultaneously programming memory in said first IC and said second IC and said third IC with a third of said memory blocks, wherein if X=3 said first IC is now programmed.

3. The method of claim 2, further including:
    (f) replacing said first IC in the first site with an unprogrammed IC; and
    (g) simultaneously programming each IC in each site with a first of said memory blocks;
    wherein said second IC is now programmed.

4. The method of claim 3, further including:
    (h) replacing said second IC in the second site with an unprogrammed IC; and
    (i) simultaneously programming each IC in each site with a second of said memory blocks;
    wherein said third IC is now programmed.

5. The method of claim 1, further including:
    (e) coupling a third IC to a third of said sites and simultaneously programming memory in said first IC and said second IC and said third IC with a third of said memory blocks,
    (f) coupling a fourth IC into a fourth of said sites, and simultaneously programming memory in each site with a fourth of said memory blocks, wherein if X=4, said first IC is now fully programmed.

6. The method of claim 5, further including:
    (g) replacing said first IC in the first site with an unprogrammed IC; and
    (h) simultaneously programming each IC in each site with a first of said memory blocks;
    wherein said second IC is now programmed.

7. The method of claim 6, further including:
    (i) replacing said second IC in the second site with an unprogrammed IC: and
    (j) simultaneously programming each IC in each site with a second of said memory blocks;
    wherein said third IC is now programmed.

8. The method of claim 7, further including:
    (k) replacing said third IC in said third site with an unprogrammed IC; and
    (l) simultaneously programming each IC in each site with a third of said memory blocks;
    wherein said fourth IC is now programmed.

9. The method of claim 2, further including at least one step selected from a group consisting of:

(f) verifying programming of the programmed said first IC; and (g) securing the programmed said first IC against change to memory blocks recorded therein.

10. The method of claim 1, wherein at least one of step (c) and step (d) includes using a socket to achieve said coupling.

11. The method of claim 1, wherein at least one of step (c) and step (d) includes confirming orientation of said coupling.

12. The method of claim 3, wherein step (f) is carried out using at least one movable pick-up head to remove the programmed said first IC from said first site and to couple said unprogrammed IC thereto.

13. The method of claim 2, further including simultaneously removing a programmed said IC from one site while coupling an unprogrammed said IC to another site.

14. A method of sequentially programming memory-containing integrated circuits (ICs) with data, comprising the following steps:

(a) providing a number of programming sites equal to X, said sites being denoted site 1, site 2, site 3, . . . site (X-1) and site X;

(b) dividing said data into X memory blocks denoted block 1, block 2, block 3, . . . block (X-1) and block X;

(c) coupling to site 1 a first IC and programming block 1 therein;

(d) coupling to site 2 a second IC and simultaneously programming block 2 therein and in said first IC;

(e) coupling to site 3 a third IC, and simultaneously programming block 3 therein and in said first IC and in said second IC;

(f) coupling to site 4 a fourth IC, and simultaneously programming block 4 therein and in said first IC and said second IC and said third IC;

repeating steps (c), (d), (e), and (f) until an IC has been programmed with X memory blocks, whereupon said IC is replaced with an unprogrammed IC, until all unprogrammed ICs have been programmed.

15. The method of claim 14, further including:

coupling to site (X-1) an (X-1)th IC, and simultaneously programming block (X-1) therein and in said first IC, said second IC, . . . the (X-2)th IC, and said (X-1)th IC.

16. The method of claim 15, further including:

coupling to site (X) an Xth IC, and simultaneously programming block X therein and in said first IC, said second IC, . . . , said (X-2)th IC, and said Xth IC.

17. The method of claim 14, further including:

simultaneously removing a programmed said IC from one site while coupling another IC to another said site.

18. A system to sequentially program memory-containing integrated circuits (ICs) with data of size Q bytes, the system comprising:

a first programmer unit having X program sites connected thereto;

a first movable pick-up head disposed to fetch unprogrammed said ICs and to coupled them one at a time to a chosen one of said X program sites;

a controller unit;

said head, coupled to said controlled unit, and disposed to couple a first of the unprogrammed said ICs to a first of said program sites;

means for programming, coupled to said controller, to program a first block of data of size Q/X into the first IC;

said head further disposed to couple a second of the unprogrammed said ICs to a second of said program sites;

said means for programming is further controlled to program simultaneously a second block of data of size Q/X into said first IC and into the second IC;

said head further disposed to couple a third of the unprogrammed said ICs to a third of said program sites;

said means for programming further controlled to program simultaneously a third block of data of size Q/X into said first IC, into said second IC, and into the third IC;

wherein if X=3, said first IC is fully programmed.

19. The system of claim 18, wherein:

said head is further disposed to couple a fourth of the unprogrammed said ICs to a fourth of said program sites; and said means for programming is further controlled to program simultaneously a fourth block of data of size Q/X into said first, IC, into said second IC, into said third IC, and into the fourth IC;

wherein if X=4, said second IC is fully programmed.

20. The system of claim 18, further including a second said movable pick-up head;

wherein said controller can cause said first head to couple an unprogrammed IC to a program site while causing said second head to remove a programmed IC from another said program site.

21. The system of claim 18, wherein:

said controller can cause said first programmer unit to carry-out at least one function selected from a group consisting of (a) confirming proper orientation of an unprogrammed said IC in a said site, (b) verifying programming of all blocks of said data in a programmed said IC, and (c) following verification of successful programming of all blocks of said data in a programmed said IC rendering said IC secure against change in programmed said data.

* * * * *